United States Patent
Lee et al.

(10) Patent No.: US 9,503,303 B2
(45) Date of Patent: Nov. 22, 2016

(54) SYMBOL MAPPING FOR BINARY CODING

(71) Applicant: BROADCOM CORPORATION, Irvine, CA (US)

(72) Inventors: Tak K. Lee, Irvine, CA (US); Ba-Zhong Shen, Irvine, CA (US); Kelly Brian Cameron, Irvine, CA (US); Hau Thien Tran, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/950,866

(22) Filed: Nov. 24, 2015

(65) Prior Publication Data

US 2016/0080109 A1 Mar. 17, 2016

Related U.S. Application Data (63) Continuation of application No. 13/907,737, filed on May 31, 2013, now Pat. No. 9,209,834.

(60) Provisional application No. 61/658,746, filed on Jun. 12, 2012, provisional application No. 61/818,485, filed on May 2, 2013.

(51) Int. Cl.
*H04L 27/36* (2006.01)
*H04L 27/34* (2006.01)
*H03M 13/05* (2006.01)
*H03M 13/37* (2006.01)
*H03M 13/00* (2006.01)
*H04L 1/00* (2006.01)

(52) U.S. Cl.
CPC .......... *H04L 27/3438* (2013.01); *H03M 13/05* (2013.01); *H03M 13/37* (2013.01); *H03M 13/617* (2013.01); *H04L 1/0041* (2013.01); *H04L 27/362* (2013.01)

(58) Field of Classification Search
CPC ............. H04L 27/362; H04L 27/3494; H04L 27/3477; H04L 27/3438; H04L 27/3433; H04L 2025/0342; H04L 1/0041; H03M 13/2906; H03M 13/37; H03M 13/05; H03M 13/617; H03M 13/25
See application file for complete search history.

(56) References Cited

U.S. PATENT DOCUMENTS

2001/0017900 A1   8/2001   Schelstraete
2010/0061479 A1   3/2010   Mazet et al.

OTHER PUBLICATIONS

Forney Jr. et al., Multidimensional constellations—Part I: introductions, figures of merit, and generalized cross constellations, Aug. 1989, IEEE Journal on selected areas in Communications, vol. 7, No. 6, pp. 877-892.*
Ron Hranac, Digital transmission, part 2, Jul. 2007, Technical Columns, Essential Knowledge for cable professionsls (scte.org), pp. 1 to 11 (retrieved from google Feb. 8, 2016).*

* cited by examiner

*Primary Examiner* — Shelly A Chase
(74) *Attorney, Agent, or Firm* — Garlick & Markison; Shayne X. Short (57) ABSTRACT

The present disclosure presents symbol mapping for any desired error correction code (ECC) and/or uncoded modulation. A cross-shaped constellation is employed to perform symbol mapping. The cross-shaped constellation is generated from a rectangle-shaped constellation. Considering the rectangle-shaped constellation and its left hand side, a first constellation point subset located along that left hand side are moved to be along a top of the cross-shaped constellation while a second constellation point subset located along that left hand side are moved to be along a bottom of the cross-shaped constellation. For example, considering an embodiment having four constellation point subsets along the left hand side of the rectangle-shaped constellation, two of those subsets are moved to be along the top of the cross-shaped constellation while two other subsets of the constellation points along the left hand side are moved to be along the bottom of the cross-shaped constellation.

20 Claims, 9 Drawing Sheets

*7 bit labels, 128 QAM (cross-shaped constellation)*

SYMBOL MAPPING FOR BINARY CODING

CROSS REFERENCE TO RELATED PATENTS/PATENT APPLICATIONS

The present U.S. Utility Patent Application claims priority pursuant to 35 U.S.C. §120 as a continuation of U.S. Utility application Ser. No. 13/907,737, entitled "Symbol mapping for binary coding," filed May 31, 2013, pending, and scheduled subsequently to be issued as U.S. Pat. No. 9,209,834 on Dec. 8, 2015 (as indicated in an ISSUE NOTIFICATION mailed from the USPTO on Nov. 18, 2015), which claims priority pursuant to 35 U.S.C. §119(e) to U.S. Provisional Application No. 61/658,746, entitled "Symbol mapping for binary coding," filed Jun. 12, 2012, and U.S. Provisional Application No. 61/818,485, entitled "Symbol mapping for binary coding," filed May 2, 2013, all of which are hereby incorporated herein by reference in their entirety and made part of the present U.S. Utility Patent Application for all purposes.

BACKGROUND

1. Technical Field

The present disclosure relates generally to communication systems; and, more particularly, to symbol mapping and/or symbol de-mapping (e.g., modulation and/or demodulation) within various communication devices operative within such communication systems.

2. Description Of Related Art

Data communication systems have been under continual development for many years. One such type of communication system that has been of significant interest lately is a communication system that employs iterative error correction codes (ECCs). Communications systems with iterative codes are often able to achieve lower bit error rates (BER) than alternative codes for a given signal to noise ratio (SNR).

An ideal communication system design goal is to achieve Shannon's limit for a communication channel. Shannon's limit may be viewed as being the data rate to be used in a communication channel, having a particular SNR that achieves error free transmission through the communication channel. In other words, the Shannon limit is the theoretical bound for channel capacity for a given modulation and code rate.

Generally speaking, within the context of communication systems, there is a first communication device at one end of a communication channel with an ECC encoder and second communication device at the other end of the communication channel with an ECC decoder. In many instances, one or both of these two communication devices includes both the encoder and decoder (e.g., for bi-directional communications). The transmitter and receiver may use various forms of symbol mapping and/or modulation to generate symbols that carry more than one bit of information (e.g., associated with constellation points of the symbol mapping and/or modulation) to increase throughput of information within such communication systems.

DETAILED DESCRIPTION

Figure 1:
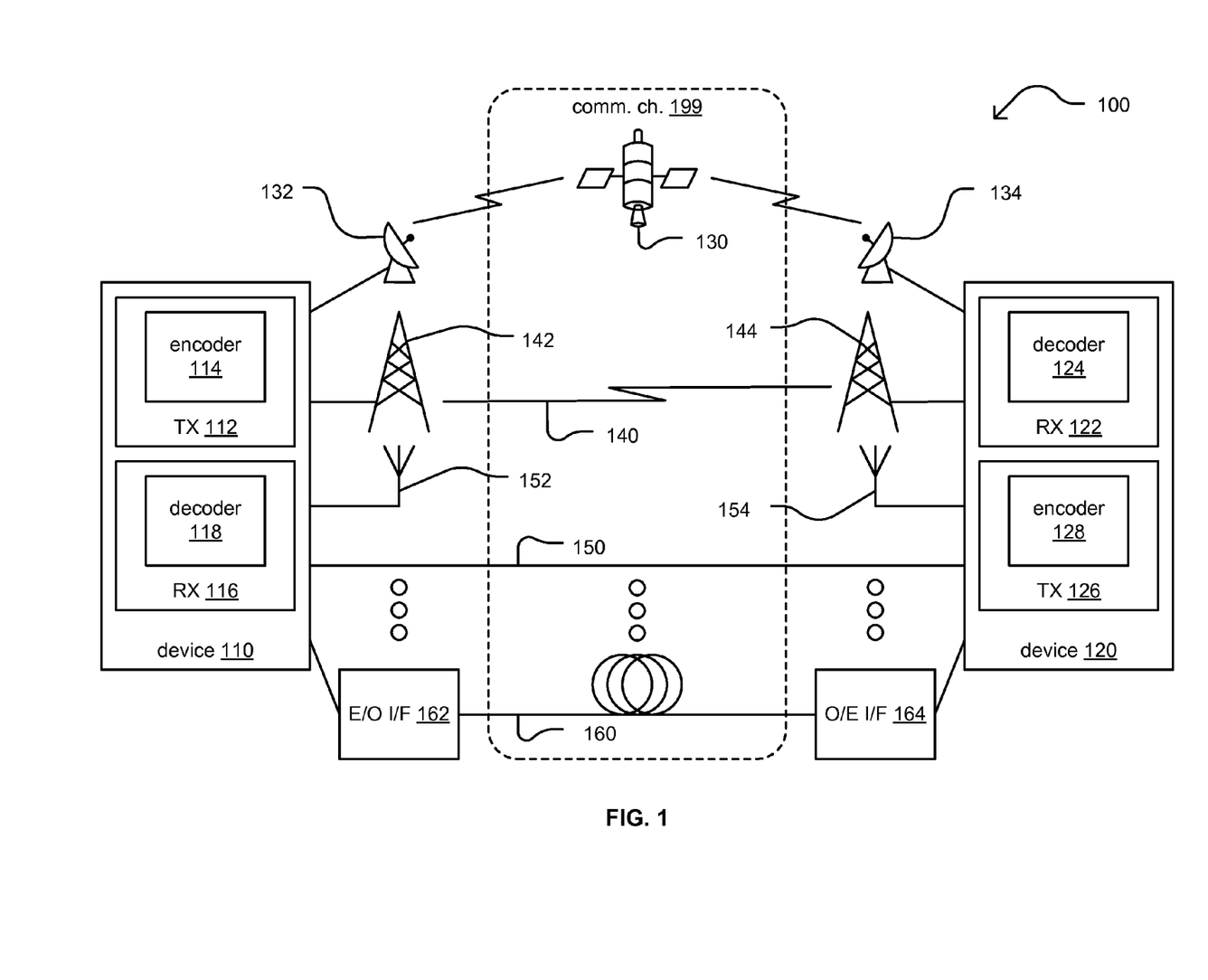
FIG. 1 illustrates an embodiment of a communication system.

FIG. 1 illustrates an embodiment of a communication system 100. The communication system 100 that includes communication devices 110 120 (only two shown) and communication system infrastructure, which supports one or more wired or wireless communication channels 199. The communication system infrastructure includes one or more of: a satellite 130 and corresponding dishes 132, 134; a wireless communication link 140 via wireless communication towers (e.g., base stations, access points, etc.) 142, 144 and/or an antennas 152, 154; fiber optic equipment such as an optical communication link 160 via an electrical to optical (E/O) interface 162 and optical to electrical (O/E) interface 164; and a wired communication link 150 (e.g., such as within a digital subscriber line (DSL) based system).

Each of the communication devices 110, 120 may be stationary or mobile devices. For example, a mobile communication device 110 and 120 is one of a cellular telephone, a tablet, a laptop computer, a video game console, a remote controller, a multimedia (e.g., audio and/or video) player, etc. As another example, a stationary communication device is a device that, while it can be moved, is generally used at a fixed location such as a computer, an access point, etc.

Each of the communication devices includes a transmitter 112, 126 and/or a receiver 116, 122. The transmitter 112, 126 includes an encoder 114, 128 and the receiver 116, 122 includes a decoder 118, 124. The encoder 114, 128 and the decoder 118, 124 utilize a constellation map that includes a plurality of constellation points and null points arranged in one or more patterns that reduce transmission errors and/or lower SNR while achieving a desired BER of a communication channel. The constellation map will be described in greater detail with reference to one or more of the subsequent figures.

Figure 2:
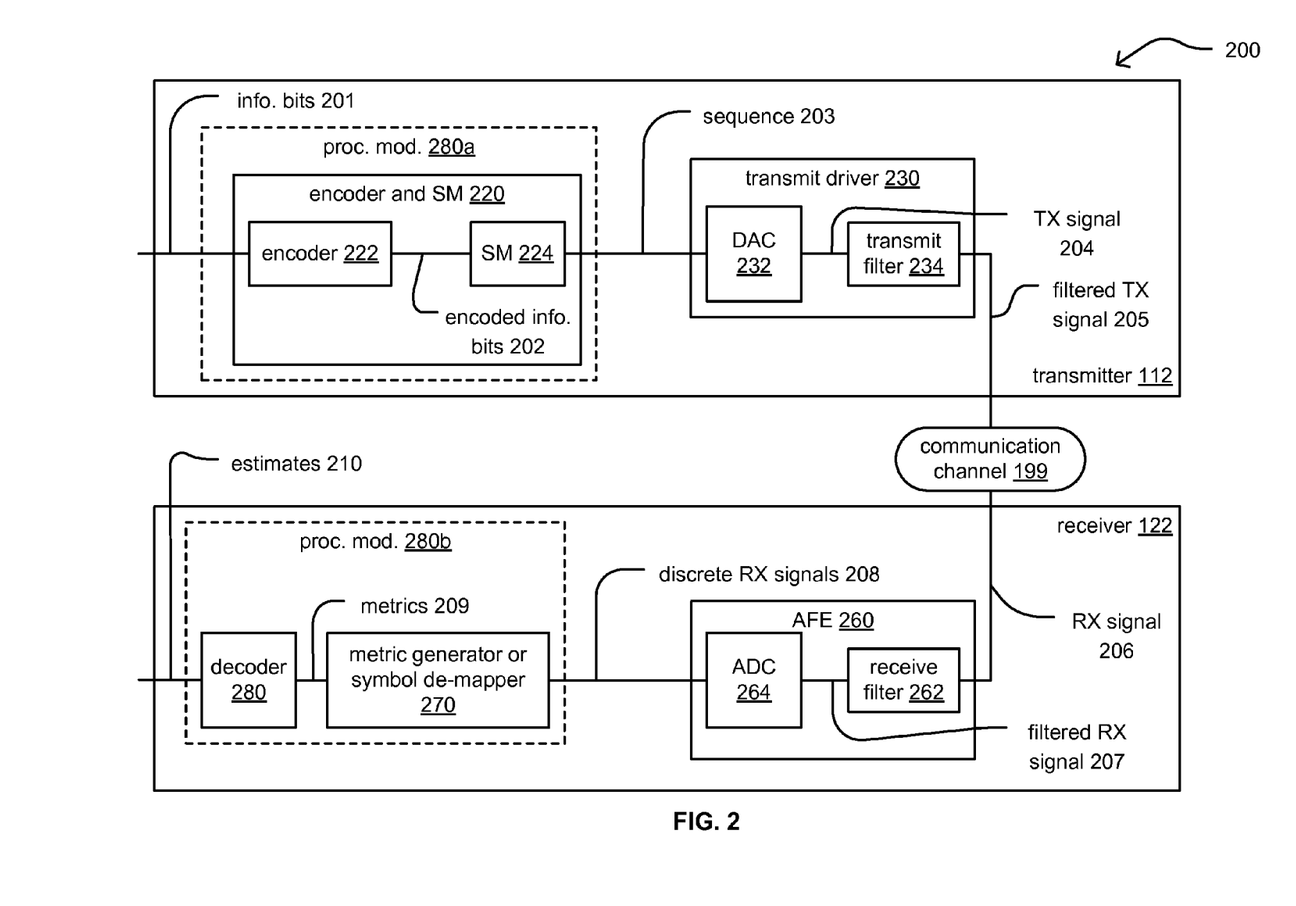
FIG. 2 illustrates an example of communication between two communication devices.

FIG. 2 illustrates an example 200 of communication between two communication devices. In this example, the transmitter 112 of one communication device 110 is transmitting a signal via the communication channel 199 to the receiver 122 of another communication device 120. The transmitter 112 includes a processing module 280a and a transmit driver 230. The processing module 280a is configured to include an encoder 222 (e.g., low density parity check (LDPC) coding, any other desired error correction code (ECC) such as turbo coding, convolutional coding, turbo trellis coded modulation (TTCM) coding, Reed-Solomon (RS) coding, BCH (Bose and Ray-Chaudhuri, and Hocquenghem) coding, etc. and/or uncoded modulation)

and a symbol mapper (SM) 224 or configured to include a combined encoder and symbol mapper 220. The transmit driver 230 includes a digital to analog converter (DAC) 232 and a transmit filter 234. The receiver 122 includes a processing module 280b and an analog front end (AFE) 260. The processing module 280b is configured to include a decoder 280 and a metric generator or symbol de-mapper 270. The AFE 260 includes a receive filter 262, which generates a filtered receive (RX) signal 207, and an analog to digital converter (DAC) 264.

In an example of operation, the encoder 222 of the transmitter 112 receives information bits 201 of data (e.g., video data, audio data, text, graphics, voice data, etc.). The encoder 222 encodes (in accordance with one or more ECC coding functions, FEC encoding functions, or other encoding functions) a number of the information bits into a plurality of encoded bits 202. For example, the encoder 222 breaks the data into 4-bit data blocks and encodes each 4-bit data block separately to produce the plurality of encoded bits (e.g., an encoded data block), which includes more bits than the data block (e.g., 5 or more bits). As such, the encoder is outputting a sequence of encoded bits; one sequence for each data block.

The symbol mapper 224 maps the encoded bits (of one encoded data block) to a constellation point of a constellation map. The constellation map includes a plurality of constellation points and null points that are arranged to one or more patterns that reduce transmission errors and/or lower SNR while achieving a desired BER of a communication channel. The symbol mapper 224 outputs a sequence of symbols 203 (e.g., constellation points corresponding to mapped encoded data blocks) to the transmit driver 230.

The DAC 232 converts the sequence of symbols into a continuous-time transmit signal 204. The transmit filter 234 (e.g., channel filter, bandpass filter, notch filter, low pass filter, high pass filter, etc.) filters the signal 204 to produce a filtered, continuous-time transmit (TX) signal 205. The transmitter 112 transmits, via the communication channel 199, the filtered TX signal 205 to the receiver 112 of the other communication device 120.

Within the receiver 122, the receive filter 262 (e.g., channel filter, bandpass filter, notch filter, low pass filter, high pass filter, etc.) filters the continuous-time receive signal 206. An analog to digital converter (ADC) 264 converts the continuous-time receive signal 206 into discrete-time receive signals 208. The metric generator or symbol de-mapper 270 calculates metrics 209 (e.g., on either a symbol and/or bit basis, which may be log-likelihood ratios (LLRs) or other types of metrics). For example, metrics 209 may be viewed as estimated constellation points on the constellation map. The decoder 280 (which essential performs the inverse of the encoder) interprets the metrics 209 to create estimates of the information bits 210.

Figure 3:
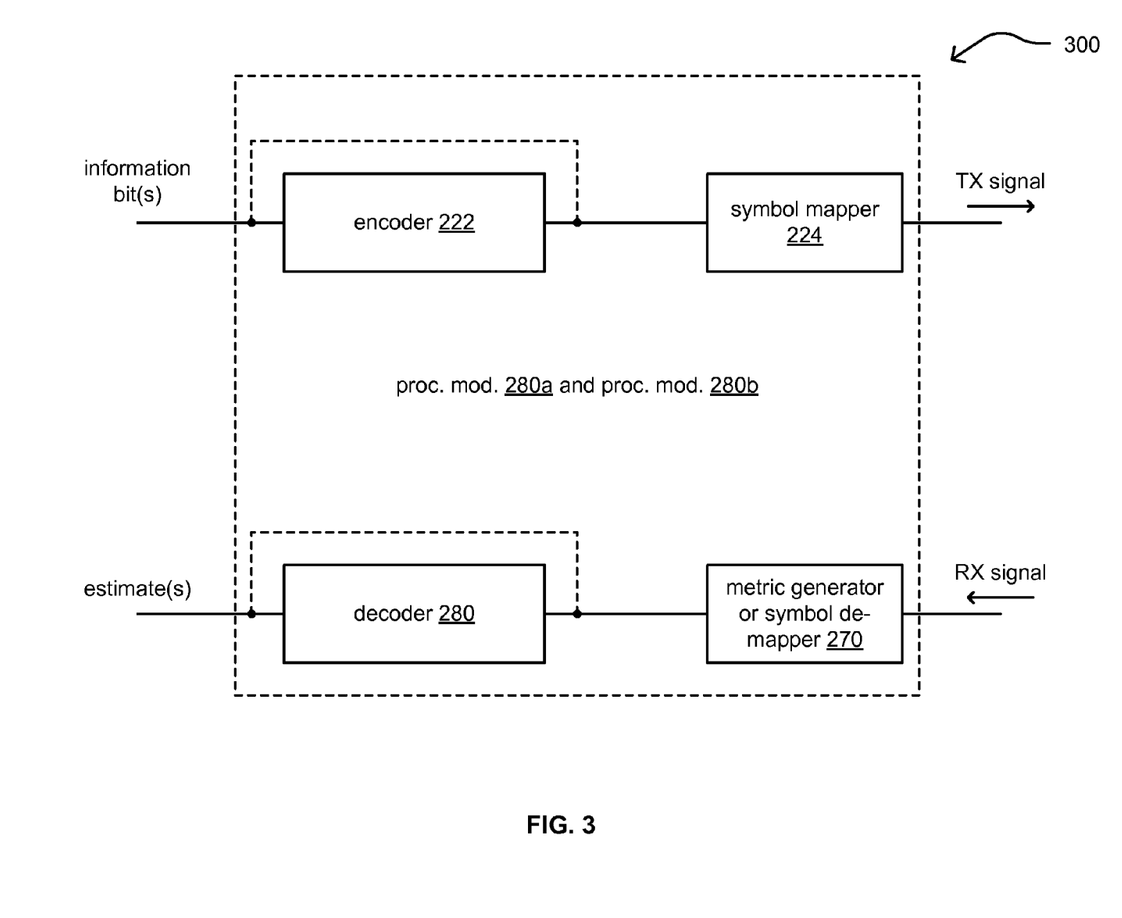
FIG. 3 illustrates embodiments of encoding and symbol mapping and symbol de-mapping and decoding.

FIG. 3 illustrates embodiments 300 of encoding and symbol mapping and symbol de-mapping and decoding. This diagram may be viewed as including processing module 280a and processing module 280b such as may be implemented in a communication device 110, 120 that includes both the encoding and decoding functions. In particular, the processing module 280 is configured to include the encoder 222, the symbol mapper 224, the metric generator or symbol de-mapper 270, and the decoder 280. The functions of these elements are as previously described. In additional to the functionality as previously described, this embodiment provides a bypass of the encoder 222 and the decoder 280. As such, for certain applications, the information bits may be directly mapped to constellation points on the constellation map.

Also, it is noted that any such desired modulation (e.g., constellation points with associated mapping/labeling of the constellation points therein) may be implemented in any of a variety of ways (e.g., look up table (LUT) [such that a symbol of bit label is mapped to a respective constellation point based on the LUT] in some form of memory, via real-time calculation using one or more processors [such as a digital signal processor (DSP)], etc. and/or any such combination of means. For example, some embodiments will store the modulation in a LUT and/or memory for relatively smaller sized constellations (e.g., including constellation points below some desired or predetermined value), and use real-time calculation to generate the modulation for relatively larger sized constellations (e.g., including constellation points equal to or above some desired or predetermined value). For example, relatively large sized constellations can require a relatively significant amount of memory, and real-time calculation may be more efficient in some embodiments.

Figure 4:
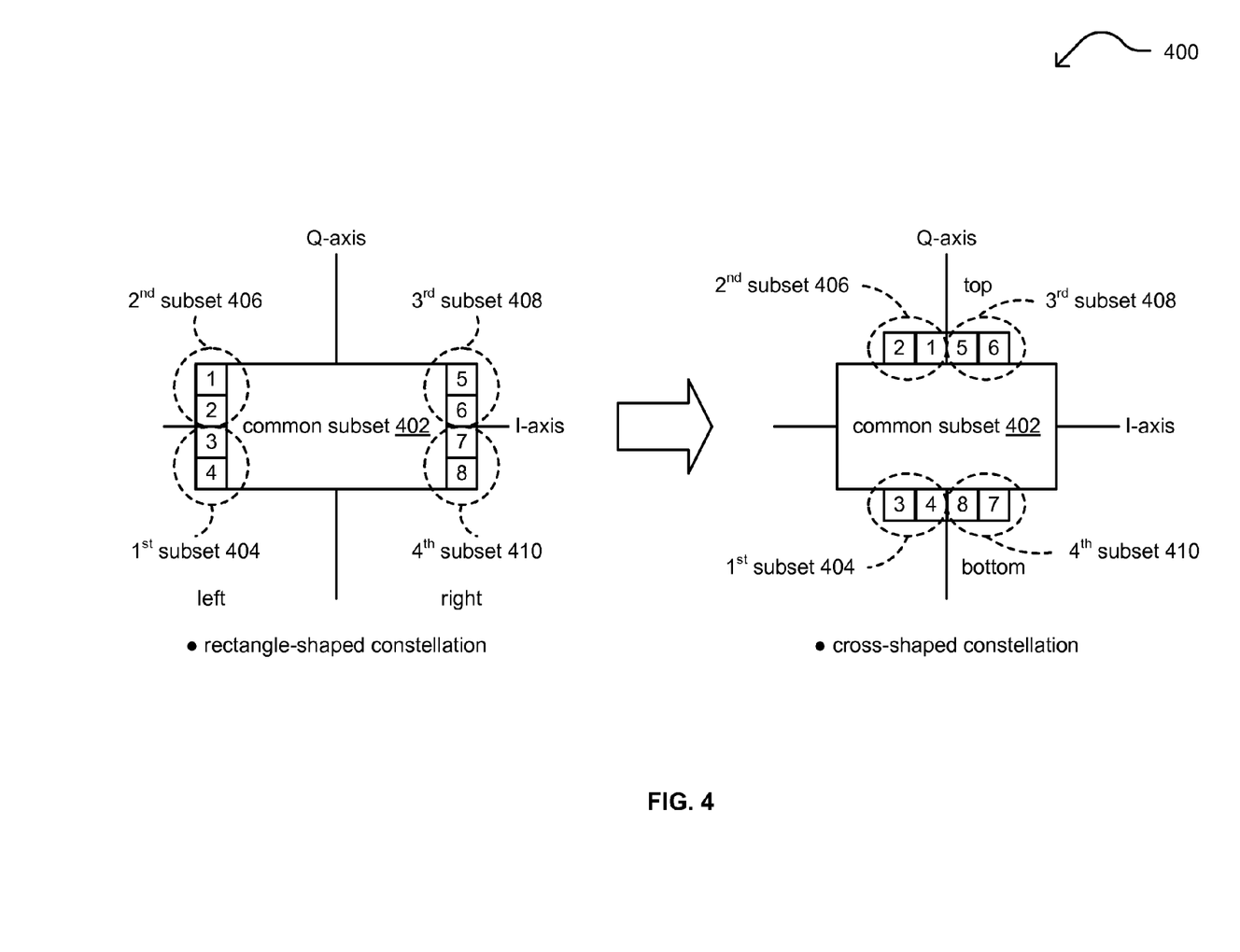
FIG. 4 illustrates an embodiment of conceptually altering a rectangle shaped constellation to achieve a cross shaped constellation.

FIG. 4 illustrates an embodiment 400 of conceptually altering a rectangle shaped constellation to achieve a cross shaped constellation. A conceptual rectangle-shaped constellation (e.g., one having more bit locations along one particular axis then along the other) includes subsets of constellation points arranged in a rectangular pattern. In this example, the subsets include a common subset 402, a first subset 404, a second subset 406, a third subset 408, and a fourth subset 410. The first and second subsets 404 and 406 are on the left side of the rectangle shaped constellation map and the third and fourth subsets 408 and 410 are on the right side of the rectangle shaped constellation map. Note that each subset of constellation points includes two or more constellation points and may be square shaped or rectangle shaped.

The conceptual rectangle shaped constellation is transformed into the cross-shaped constellation by rearranging some of the subsets. In this example, the common subset 402 is positioned similarly, with respect to first and second axis (e.g., an I axis and a Q axis) in the cross-shaped constellation as it is in the rectangle shaped constellation. The first subset of the constellation points 404 is relocated from the left hand side of the rectangle shaped constellation to the bottom of the cross-shaped constellation; the second subset of the constellation points 406 is relocated from the left hand side of the rectangle shaped constellation to the top of the cross-shaped constellation; the third subset of the constellation points 408 is relocated from the right hand side of the rectangle shaped constellation to the top of the cross-shaped constellation; and the fourth subset of the constellation points 410 is relocated from the right hand side of the rectangle shaped constellation to the top of the cross-shaped constellation.

As an alternative, the orientation of the conceptual rectangle shaped constellation may be rotated ninety degrees such that there are more constellation points along the Q axis than the I axis. In this alternative, the cross shaped constellation would be similarly rotated.

In one embodiment, a modification of the mapping performed in accordance with the G.hn communication standard, specifically, Step 3 in Section 7.1.4.3.1.2 Constellations for odd number of bits of Rec. ITU-T G.9960 (December 2011), which includes the following formulas:

$|Q'|=|I|-2s$, and sign $(Q')$=sign $(I)$;

$|I'|=M_Q-|Q|$, and sign $(I')$=sign $(Q)$.

Modification of these respective formulas by their replacement as follows:

if (|Q|<2s) then

|I'|=|I|−4s, and sign (I')=sign (I);

|Q'|=|Q|+4s, and sign (Q')=sign (Q).

else

|I'|=$M_f$−|I|, and sign (I')=sign (I);

|Q'|=$M_f$−|Q|, and sign (Q')=sign (Q).

endif will result in the modification of the rectangle-shaped constellation to generate the cross-shaped constellation in accordance with various embodiments and/or their equivalents herein.

In general, the conceptual conversion of a rectangle shaped constellation into a shape as shown herein may be performed in accordance with any desired symbols or bit labels having an odd number of bits therein (e.g., 3, 5, 7, 9, 11, etc.). For example, a given symbol or bit label can include an odd number of encoded bits, N, where N is an odd-valued integer, and the modulation can would then include Y=$2^N$ constellation points (e.g., if N=5, then Y=32; if N=7, then Y=128; etc.).

Figure 5:
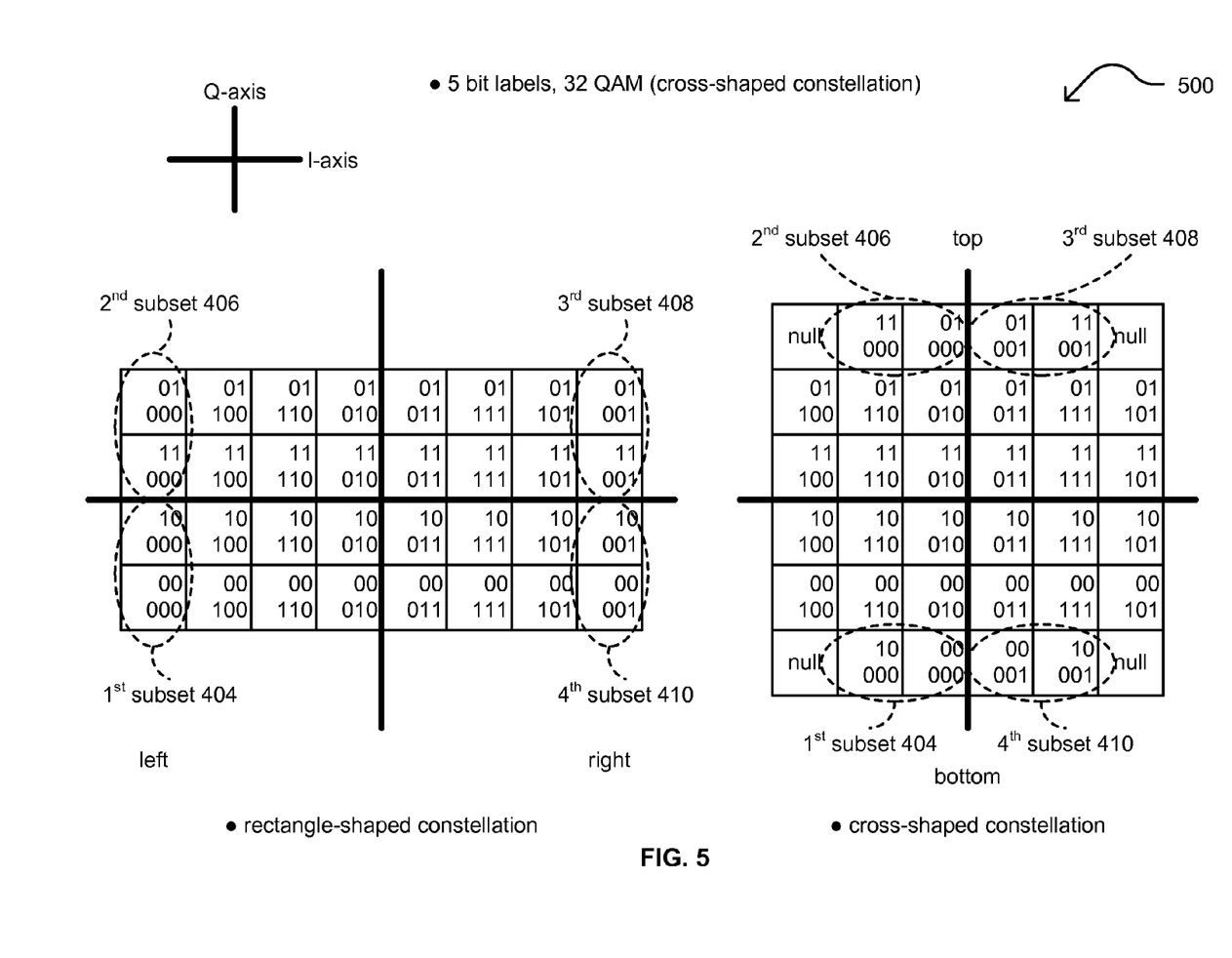
FIG. 5 illustrates an example of 32 QAM constellation in accordance with the present disclosure.

FIG. 5 illustrates an example 500 of 32 QAM constellation map (or just constellation) in accordance with the present disclosure. The constellation includes a plurality of constellation points and null points at the corners (e.g., a null may be viewed as a location that does not include a constellation point). FIG. 5 further illustrates a conceptual rectangle shaped constellation that includes four rows and eight columns centered about the origin of the intersection of a first and second axis. The axis forms quadrants; each quadrant including eight constellation points.

The conceptual rectangle shaped constellation includes a common subset of constellation points, a first subset of constellation points, a second subset of constellation points, a third subset of constellation points, and a fourth subset of constellation points. The first subset includes constellation points corresponding symbols 01 000 and 11 000; the second subset includes constellation points corresponding to symbols 10 000 and 00 000; the third subset includes constellation points corresponding to symbols 01 001 and 11 001; the fourth subset includes constellation points corresponding to symbols 10 001 and 00 001; the common subset includes the remaining constellation points.

The conceptual rectangle shaped constellation is conceptually modified to the desired constellation by moving the first, second, third, and fourth subsets of constellation points as shown. The resulting constellation has a cross shape with null points in the corners. In effect, by relocating constellation points of a conceptual rectangle shaped constellation into the desired shape, the collective magnitude of the vector of the relocated constellation points is less than the collective magnitudes of the vectors if not relocated. Further, the new pattern maintains a one-bit difference between symbols of vertical and horizontal adjacent constellation points.

The new pattern of the constellation also has symmetry about the axis. For example, the pattern of constellation points and null points of the first quadrant (e.g., upper left quadrant on the figure) is the mirror image about the vertical axis as the pattern of constellation points and null points of the second quadrant (e.g., the upper right quadrant on the figure). In this example, the first quadrant also a mirrored pattern of constellation points and null points, about the horizontal axis, as the pattern of the third quadrant (e.g., the lower left quadrant of the figure). As a further example, the second quadrant has a mirrored pattern of constellation points and null points, about the horizontal axis, as the pattern of the fourth quadrant (e.g., the lower right quadrant of the figure).

Figure 6:
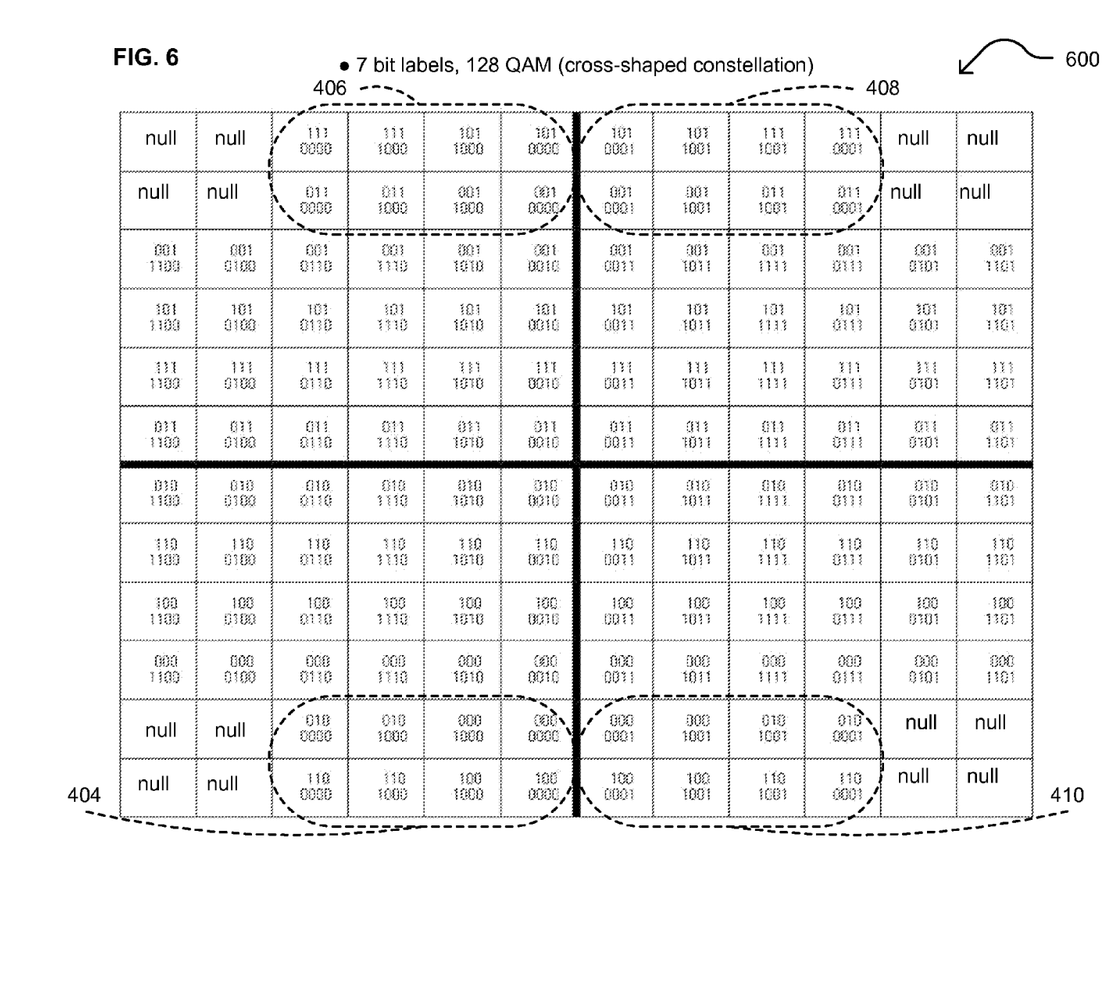
FIG. 6 illustrates an example of 128 QAM constellation in accordance with the present disclosure.

FIG. 6 illustrates an example 600 of 128 QAM constellation in accordance with the present disclosure. In this example, the constellation includes 128 constellation points (one for each symbol in the range of 0 to $2^8$) and sixteen null points. The concept of modifying a rectangle shaped constellation into the present constellation is the same as discussed with reference to FIGS. 4 and 5, with a difference being the number of constellation points in a subset. In this example, the first subset includes eight constellation points (111 0000, 111 1000, 101 1000, 101 000, 011 0000, 011 1000, 001 1000, and 001 0000), and so on.

The 128 QAM constellation has a cross shaped pattern of constellation points with null points in the corners and, by relocating constellation points of a conceptual rectangle shaped constellation into the desired shape, the magnitude of the vector of the relocated constellation points is most often less than the magnitude of the vector if not relocated. Further, the new pattern maintains a one-bit difference between symbols of vertical and horizontal adjacent constellation points and has symmetry from quadrant to quadrant about the vertical and/or horizontal axis.

Figure 6A:
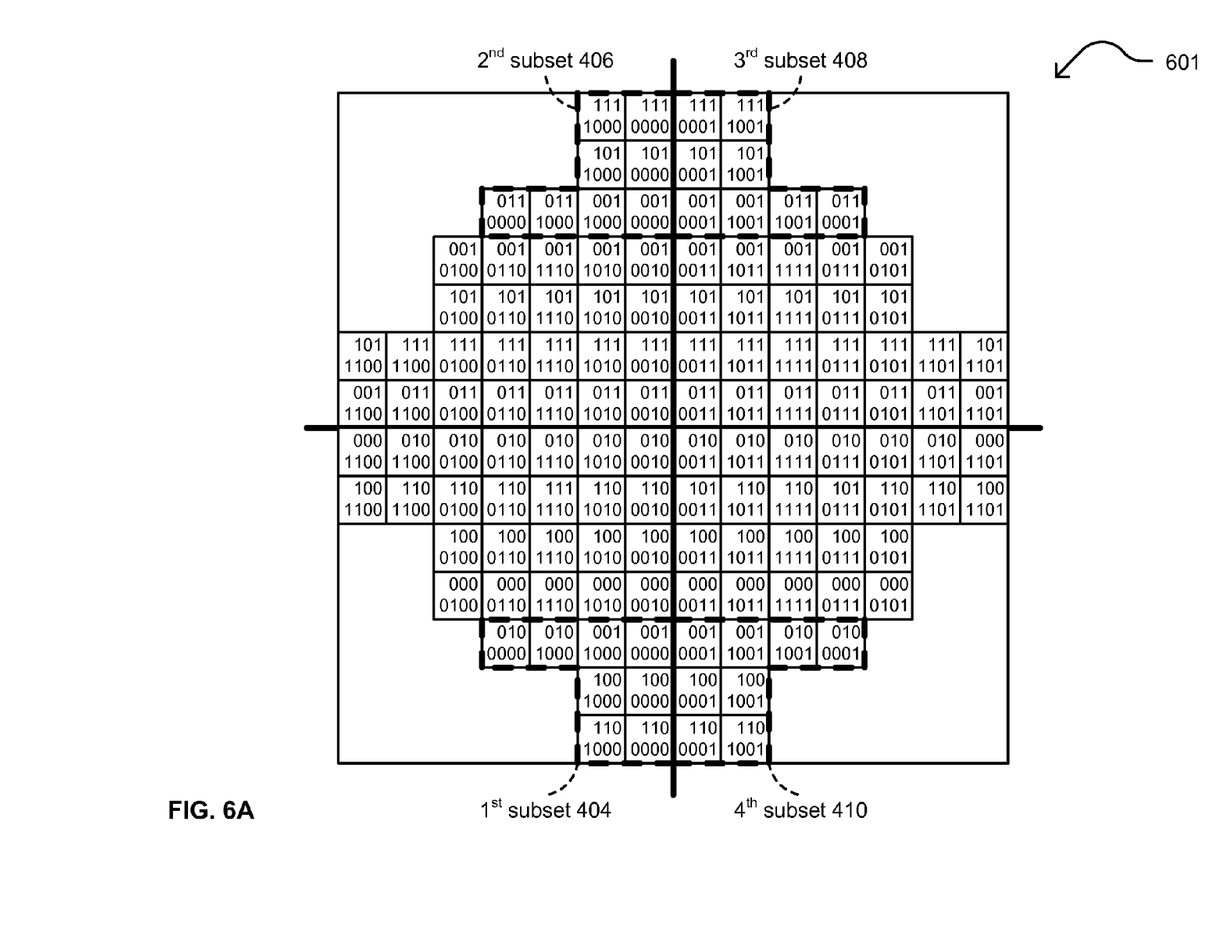
FIG. 6A illustrates another example of a 128 QAM constellation in accordance with the present disclosure.

FIG. 6A illustrates another example 601 of a 128 QAM constellation in accordance with the present disclosure. In this example, the constellation includes 128 constellation points (one for each symbol in the range of 0 to $2^8$), a plurality of null points, and the modification of the conceptual rectangle shaped constellation is somewhat different. As with FIG. 6, the conceptual rectangle shaped constellation includes the first, second, third, fourth, and common subsets of constellation points. In this example, however, the first, second, third, and fourth subsets are relocated differently.

In particular, the subsets are relocated to maintain the 1 bit difference between symbols of horizontally and vertically adjacent constellation points and collectively reduce the magnitude of the vector for the relocated constellation points with respect to the rectangle shaped constellation. For example, the constellation points of the first subset 404 are relocated as shown. In a particular example, constellation point corresponding to symbol 111 1000 is shown in row 6, column 3 of quadrant 1 (from the origin) in FIG. 6 and is shown in row 7, column 2 of quadrant 1 in FIG. 6A. Further, the constellation point corresponding to symbol 111 0000 is shown in row 6, column 4 of quadrant 1 of FIG. 6 and in row 7, column 1 of quadrant 1 of FIG. 6A. Note that there are 17 null points in each of the four corners of a square outline encompassing the 128 QAM constellation.

Figure 7:
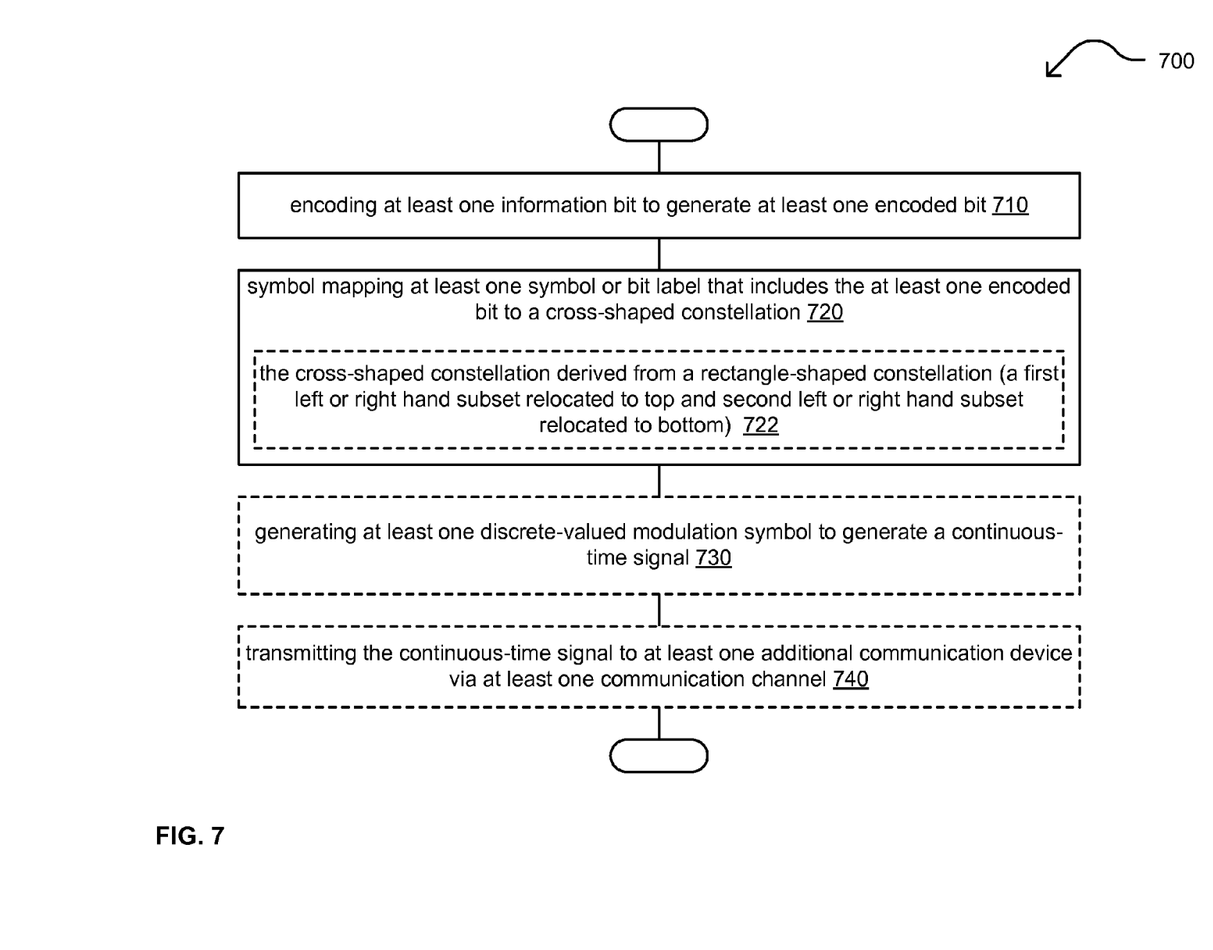
FIG. 7 is a diagram illustrating an embodiment of a method for operating one or more wireless communication devices.

FIG. 7 is a diagram illustrating an embodiment of a method 700 for operating one or more wireless communication devices. One implementation of the method 700 operates by performing only the operations of the blocks 710 and 720. Another implementation of the method 700 operates by performing only the operations of the blocks 710, 720, and 722. Yet another implementation of the method 700 operates by performing operations of all of the blocks therein.

Referring to the diagram, the method 700 begins by encoding at least one information bit to generate at least one encoded bit, as shown in a block 710.

The method 700 continues by operating a symbol mapper (e.g., of communication device) to map at least one symbol or bit label including the at least one encoded bit to a cross-shaped constellation, as shown in a block 720.

With respect to the cross-shaped constellation employed, it may be viewed as being derived from a rectangle-shaped constellation. For example, the cross-shaped constellation derived from a rectangle-shaped constellation having a plurality of constellation points including subsets of the plurality of constellation points along either a left hand side or a right hand side of the rectangle-shaped constellation such that a first of the subsets of the plurality of constellation points relocated to be along a top of the cross-shaped constellation and a second of the subsets of the plurality of constellation points relocated to be along a bottom of the cross-shaped constellation, as shown in a block 722. This transformation may alternatively be viewed as generating a constellation that includes a plurality of constellation points and a set of null points orientated with respect to at least one of a first axis and a second axis, and such that quadrants of the constellation, from quadrant to quadrant along at least one of the first axis and the second axis, have a mirroring pattern of constellation points of the plurality of constellation points and of null points of the set of null points.

In certain embodiments, the method 700 then operates by operating a transmit driver of the communication device to process at least one discrete-valued modulation symbol (e.g., generated by the symbol mapper) to generate a continuous-time signal, as shown in a block 730.

Also, in certain embodiments, the method 700 continues by transmitting the continuous-time signal to at least one additional communication device via at least one communication channel, as shown in a block 740.

Figure 8:
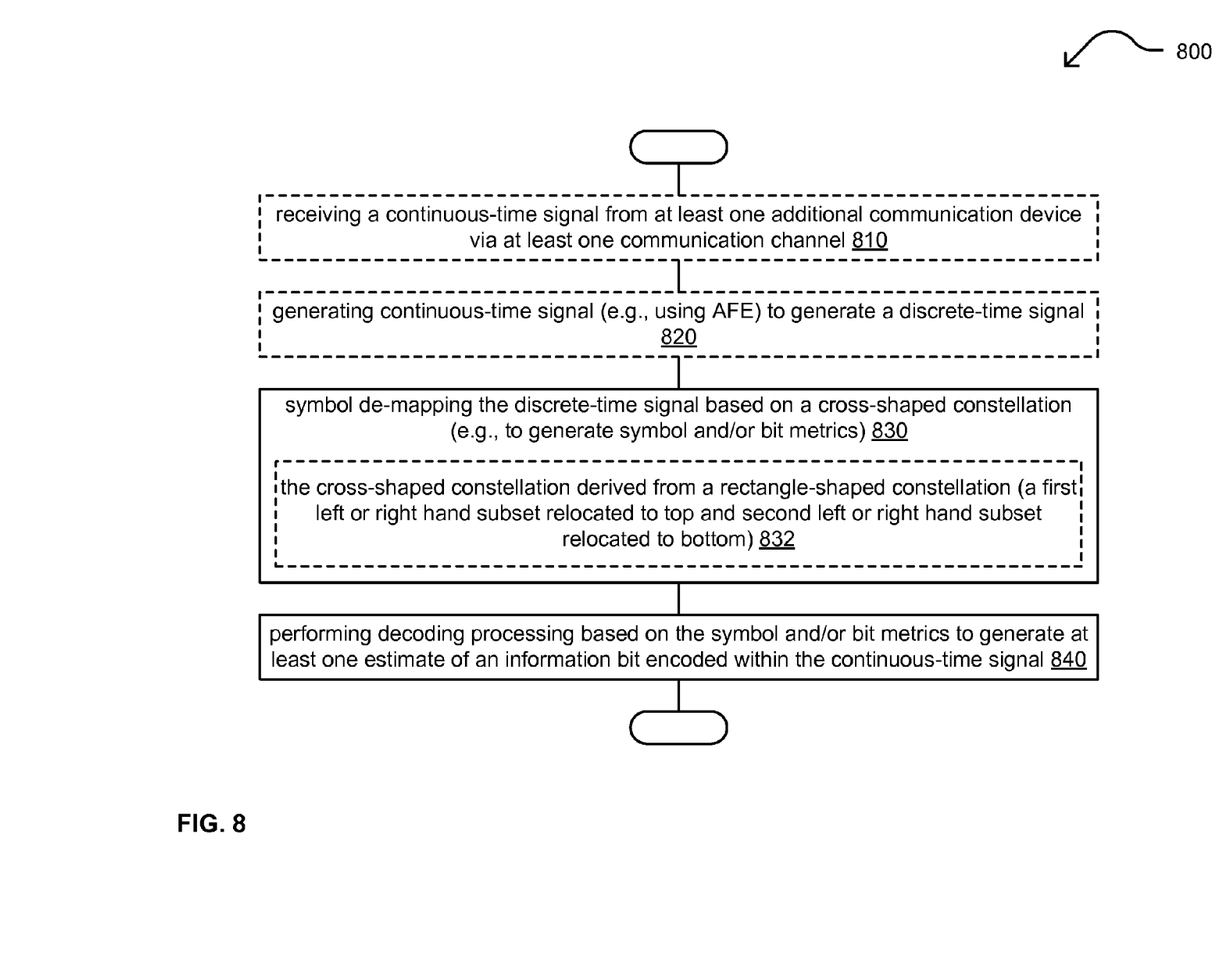
FIG. 8 is a diagram illustrating another embodiment of a method for operating one or more wireless communication devices.

FIG. 8 is a diagram illustrating another embodiment of a method 800 for operating one or more wireless communication devices. Referring to method 800 of FIG. 8, one implementation of the method 800 operates by performing only the operations of the blocks 830 and 840. Another implementation of the method 800 operates by performing only the operations of the blocks 830, 832, and 840. Yet another implementation of the method 800 operates by performing operations of all of the blocks therein.

Referring to the diagram, the method 800 begins by receiving a continuous-time signal from at least one additional communication device via at least one communication channel (e.g., via at least one input and/or communication interface of a communication device), as shown in a block 810.

The method 800 continues by operating an analog front end (AFE) of the communication device to process the continuous-time signal to generate a discrete-time signal, as shown in a block 820.

The method 800 then operates by operating a symbol de-mapper of the communication device to process the discrete-time signal based on a cross-shaped constellation (e.g., to generate symbol and/or bit metrics), as shown in a block 830.

With respect to the cross-shaped constellation employed, it may be viewed as being derived from a rectangle-shaped constellation. For example, the cross-shaped constellation derived from a rectangle-shaped constellation having a plurality of constellation points including subsets of the plurality of constellation points along either a left hand side or a right hand side of the rectangle-shaped constellation such that a first of the subsets of the plurality of constellation points relocated to be along a top of the cross-shaped constellation and a second of the subsets of the plurality of constellation points relocated to be along a bottom of the cross-shaped constellation, as shown in a block 832.

The method 800 continues by performing decoding processing based on the symbol and/or bit metrics to generate at least one estimate of an information bit encoded within the continuous-time signal, as shown in a block 840.

The present invention has been described herein with reference to at least one embodiment. Such embodiment(s) of the present invention have been described with the aid of structural components illustrating physical and/or logical components and with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims that follow. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may also be used herein, the terms "processing module," "processing circuit," "processing circuitry," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path.

While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a functional block, hardware, and/or software stored on memory for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
  a processor configured to:
    map a symbol label to a constellation point of a cross-shaped constellation to generate a symbol for transmission via a communication channel, wherein the cross-shaped constellation includes a plurality of constellation points and a set of null points arranged in a square-shape or a rectangle-shape around an origin of a first axis and a second axis, wherein the set of null points includes corners of the square-shape or the rectangle-shape and correspond to locations not including constellation points.

2. The communication device of claim 1, wherein the processor is further configured to:
  encode at least one information bit to generate at least one encoded bit; and
  generate the symbol label based on the at least one encoded bit.

3. The communication device of claim 1, wherein the processor is further configured to:
  transmit the symbol to at least one other communication device via at least one communication channel that includes the communication channel.

4. The communication device of claim 1, wherein the cross-shaped constellation is based on a rectangle-shaped constellation having another plurality of constellation points that includes subsets of the another plurality of constellation points along at least one of a left hand side or a right hand side of the rectangle-shaped constellation, wherein a first subset of the subsets of the another plurality of constellation points is relocated to a top of the cross-shaped constellation and a second subset of the subsets of the another plurality of constellation points is relocated to a bottom of the cross-shaped constellation.

5. The communication device of claim 1, wherein the symbol label includes an odd number of encoded bits, N, wherein N is an odd-valued integer, and wherein the plurality of constellation points includes $2^N$ constellation points.

6. The communication device of claim 1, wherein the plurality of constellation points and the set of null points have a mirroring pattern from quadrant to quadrant along at least one of the first axis or the second axis.

7. The communication device of claim 1, wherein:
  a first plurality of null points of the set of null points is arranged in another square-shape and is located in a first corner of the square-shape or the rectangle-shape;
  a second plurality of null points of the set of null points is arranged in the another square-shape and is located in a second corner of the square-shape or the rectangle-shape;
  a third plurality of null points of the set of null points is arranged in the another square-shape and is located in a third corner of the square-shape or the rectangle-shape; and
  a fourth plurality of null points of the set of null points is arranged in the another square-shape and is located in a fourth corner of the square-shape or the rectangle-shape.

8. The communication device of claim 1, wherein the processor is further configured to:
  support communications within at least one of a satellite communication system, a wireless communication system, a wired communication system, a fiber-optic communication system, or a mobile communication system.

9. A communication device comprising:
a processor configured to:
encode at least one information bit to generate at least one encoded bit;
generate a symbol label based on the at least one encoded bit;
map the symbol label to a constellation point of a cross-shaped constellation to generate a symbol, wherein the cross-shaped constellation includes a plurality of constellation points and a set of null points arranged in a square-shape or a rectangle-shape around an origin of a first axis and a second axis, wherein the set of null points includes corners of the square-shape or the rectangle-shape and correspond to locations not including constellation points; and
transmit the symbol to at least one other communication device via at least one communication channel.

10. The communication device of claim 9, wherein the cross-shaped constellation is based on a rectangle-shaped constellation having another plurality of constellation points that includes subsets of the another plurality of constellation points along at least one of a left hand side or a right hand side of the rectangle-shaped constellation, wherein a first subset of the subsets of the another plurality of constellation points is relocated to a top of the cross-shaped constellation and a second subset of the subsets of the another plurality of constellation points is relocated to a bottom of the cross-shaped constellation.

11. The communication device of claim 9, wherein:
the symbol label includes an odd number of encoded bits, N, wherein N is an odd-valued integer, and wherein the plurality of constellation points includes $2^N$ constellation points; and
the plurality of constellation points and the set of null points have a mirroring pattern from quadrant to quadrant along at least one of the first axis or the second axis.

12. The communication device of claim 9, wherein:
a first plurality of null points of the set of null points is arranged in another square-shape and is located in a first corner of the square-shape or the rectangle-shape;
a second plurality of null points of the set of null points is arranged in the another square-shape and is located in a second corner of the square-shape or the rectangle-shape;
a third plurality of null points of the set of null points is arranged in the another square-shape and is located in a third corner of the square-shape or the rectangle-shape; and
a fourth plurality of null points of the set of null points is arranged in the another square-shape and is located in a fourth corner of the square-shape or the rectangle-shape.

13. The communication device of claim 9, wherein the processor is further configured to:
support communications within at least one of a satellite communication system, a wireless communication system, a wired communication system, a fiber-optic communication system, or a mobile communication system.

14. A method for execution by a communication device, the method comprising:
mapping a symbol label to a constellation point of a cross-shaped constellation to generate a symbol, wherein the cross-shaped constellation includes a plurality of constellation points and a set of null points arranged in a square-shape or a rectangle-shape around an origin of a first axis and a second axis, wherein the set of null points includes corners of the square-shape or the rectangle-shape and correspond to locations not including constellation points; and
transmitting, via a communication interface of the communication device, the symbol to at least one other communication device via at least one communication channel.

15. The method of claim 14 further comprising:
encoding at least one information bit to generate at least one encoded bit; and
generating the symbol label based on the at least one encoded bit.

16. The method of claim 14, wherein the cross-shaped constellation is based on a rectangle-shaped constellation having another plurality of constellation points that includes subsets of the another plurality of constellation points along at least one of a left hand side or a right hand side of the rectangle-shaped constellation, wherein a first subset of the subsets of the another plurality of constellation points is relocated to a top of the cross-shaped constellation and a second subset of the subsets of the another plurality of constellation points is relocated to a bottom of the cross-shaped constellation.

17. The method of claim 14, wherein the symbol label includes an odd number of encoded bits, N, wherein N is an odd-valued integer, and wherein the plurality of constellation points includes $2^N$ constellation points.

18. The method of claim 14, wherein the plurality of constellation points and the set of null points have a mirroring pattern from quadrant to quadrant along at least one of the first axis or the second axis.

19. The method of claim 14, wherein:
a first plurality of null points of the set of null points is arranged in another square-shape and is located in a first corner of the square-shape or the rectangle-shape;
a second plurality of null points of the set of null points is arranged in the another square-shape and is located in a second corner of the square-shape or the rectangle-shape;
a third plurality of null points of the set of null points is arranged in the another square-shape and is located in a third corner of the square-shape or the rectangle-shape; and
a fourth plurality of null points of the set of null points is arranged in the another square-shape and is located in a fourth corner of the square-shape or the rectangle-shape.

20. The method of claim 14 further comprising:
operating the communication interface of the communication device to support communications within at least one of a satellite communication system, a wireless communication system, a wired communication system, a fiber-optic communication system, or a mobile communication system.

* * * * *